(12) United States Patent
Somekh et al.

(10) Patent No.: US 8,383,202 B2
(45) Date of Patent: Feb. 26, 2013

(54) METHOD AND APPARATUS FOR LOAD-LOCKED PRINTING

(75) Inventors: Sass Somekh, Los Altos, CA (US); Eliyahu Vronsky, Los Altos, CA (US)

(73) Assignee: Kateeva, Inc., Menlo Park, CA (US)

( * ) Notice: Subject to any disclaimer, the term of this patent is extended or adjusted under 35 U.S.C. 154(b) by 418 days.

(21) Appl. No.: 12/652,040

(22) Filed: Jan. 5, 2010

(65) Prior Publication Data

US 2010/0201749 A1    Aug. 12, 2010

Related U.S. Application Data

(63) Continuation-in-part of application No. 12/139,391, filed on Jun. 13, 2008.

(60) Provisional application No. 61/142,575, filed on Jan. 5, 2009.

(51) Int. Cl.
*B05D 1/26* (2006.01)

(52) U.S. Cl. .............. 427/261; 427/66; 427/287

(58) Field of Classification Search ............ 427/66, 427/261, 287
See application file for complete search history.

(56) References Cited

U.S. PATENT DOCUMENTS

| | | | |
|---|---|---|---|
| 4,238,807 A | 12/1980 | Bovio et al. |
| 4,751,531 A | 6/1988 | Saito et al. |
| 5,041,161 A | 8/1991 | Cooke et al. |
| 5,116,148 A | 5/1992 | Ohara et al. |
| 5,155,502 A | 10/1992 | Kimura et al. |
| 5,172,139 A | 12/1992 | Sekiya et al. |
| 5,202,659 A | 4/1993 | DeBonte et al. |
| 5,247,190 A | 9/1993 | Friend et al. |
| 5,405,710 A | 4/1995 | Dodabalapur et al. |
| 5,574,485 A | 11/1996 | Anderson et al. |
| 5,623,292 A | 4/1997 | Shrivasta |
| 5,703,436 A | 12/1997 | Forrest et al. |
| 5,707,745 A | 1/1998 | Forrest et al. |
| 5,731,828 A | 3/1998 | Ishinaga et al. |
| 5,781,210 A | 7/1998 | Hirano et al. |
| 5,801,721 A | 9/1998 | Gandy et al. |
| 5,834,893 A | 11/1998 | Bulovic et al. |
| 5,844,363 A | 12/1998 | Gu et al. |
| 5,865,860 A | 2/1999 | Delnick |
| 5,947,022 A | 9/1999 | Freeman et al. |
| 5,956,051 A | 9/1999 | Davies et al. |
| 6,013,982 A | 1/2000 | Thompson et al. |

(Continued)

FOREIGN PATENT DOCUMENTS

| | | |
|---|---|---|
| EP | 1 626 103 | 2/2006 |
| JP | 06-122201 | 5/1994 |

(Continued)

OTHER PUBLICATIONS

Street et al., "Jet Printing of Active-Matrix TFT Backplanes for Displays and Sensors", *IS&T Archiving*, Dec. 2005, vol. 20, No. 5, 16 pages.

(Continued)

*Primary Examiner* — Frederick Parker

(57) ABSTRACT

The disclosure relates to a method and apparatus for preventing oxidation or contamination during a circuit printing operation. The circuit printing operation can be directed to OLED-type printing. In an exemplary embodiment, the printing process is conducted at a load-locked printer housing having one or more of chambers. Each chamber is partitioned from the other chambers by physical gates or fluidic curtains. A controller coordinates transportation of a substrate through the system and purges the system by timely opening appropriate gates. The controller may also control the printing operation by energizing the print-head at a time when the substrate is positioned substantially thereunder.

11 Claims, 9 Drawing Sheets

U.S. PATENT DOCUMENTS

| | | | |
|---|---|---|---|
| 6,065,825 A | 5/2000 | Anagnostopoulos et al. | |
| 6,086,195 A | 7/2000 | Bohorquez et al. | |
| 6,086,196 A | 7/2000 | Ando et al. | |
| 6,086,679 A | 7/2000 | Lee et al. | |
| 6,087,196 A | 7/2000 | Sturm et al. | |
| 6,091,195 A | 7/2000 | Forrest et al. | |
| 6,095,630 A | 8/2000 | Horii et al. | |
| 6,097,147 A | 8/2000 | Baldo et al. | |
| 6,189,989 B1 | 2/2001 | Hirabayashi et al. | |
| 6,250,747 B1 | 6/2001 | Hauck | |
| 6,257,706 B1 | 7/2001 | Ahn | |
| 6,294,398 B1 | 9/2001 | Kim et al. | |
| 6,303,238 B1 | 10/2001 | Thompson et al. | |
| 6,312,083 B1 | 11/2001 | Moore | |
| 6,326,224 B1 | 12/2001 | Xu et al. | |
| 6,337,102 B1 | 1/2002 | Forrest et al. | |
| 6,431,702 B2 | 8/2002 | Ruhe | |
| 6,444,400 B1 | 9/2002 | Cloots et al. | |
| 6,453,810 B1 | 9/2002 | Rossmeisl et al. | |
| 6,460,972 B1 | 10/2002 | Trauernicht et al. | |
| 6,468,819 B1 | 10/2002 | Kim et al. | |
| 6,472,687 B1 | 10/2002 | Wu et al. | |
| 6,498,802 B1 | 12/2002 | Chu et al. | |
| 6,513,903 B2 | 2/2003 | Sharma et al. | |
| 6,548,956 B2 | 4/2003 | Forrest et al. | |
| 6,562,405 B2 | 5/2003 | Eser et al. | |
| 6,576,134 B1 | 6/2003 | Agner | |
| 6,586,763 B2 | 7/2003 | Marks et al. | |
| 6,601,936 B2 | 8/2003 | McDonald | |
| 6,666,548 B1 | 12/2003 | Sadasivan et al. | |
| 6,811,896 B2 | 11/2004 | Aziz et al. | |
| 6,824,262 B2 | 11/2004 | Kubota et al. | |
| 6,861,800 B2 | 3/2005 | Tyan et al. | |
| 6,896,346 B2 | 5/2005 | Trauernicht et al. | |
| 6,911,671 B2 | 6/2005 | Marcus et al. | |
| 6,917,159 B2 | 7/2005 | Tyan et al. | |
| 6,982,005 B2 | 1/2006 | Eser et al. | |
| 7,023,013 B2 | 4/2006 | Ricks et al. | |
| 7,077,513 B2 | 7/2006 | Kimura et al. | |
| 7,247,394 B2 | 7/2007 | Hatwar et al. | |
| 7,374,984 B2 | 5/2008 | Hoffman | |
| 7,377,616 B2 | 5/2008 | Sakurai | |
| 7,404,862 B2 | 7/2008 | Shtein et al. | |
| 7,406,761 B2 | 8/2008 | Jafri et al. | |
| 7,410,240 B2 | 8/2008 | Kadomatsu et al. | |
| 7,431,435 B2 | 10/2008 | Lopez et al. | |
| 7,431,968 B1 | 10/2008 | Shtein et al. | |
| 7,530,778 B2 | 5/2009 | Yassour et al. | |
| 7,603,028 B2 | 10/2009 | Yassour et al. | |
| 7,604,439 B2 | 10/2009 | Yassour et al. | |
| 7,648,230 B2 | 1/2010 | Kachi | |
| 7,677,690 B2 | 3/2010 | Takatsuka | |
| 7,802,537 B2 | 9/2010 | Kang et al. | |
| 7,857,121 B2 | 12/2010 | Yassour | |
| 7,883,832 B2 | 2/2011 | Colburn et al. | |
| 7,908,885 B2 | 3/2011 | Devitt | |
| 8,128,753 B2 | 3/2012 | Bulovic et al. | |
| 2001/0045973 A1 | 11/2001 | Sharma et al. | |
| 2002/0008732 A1 | 1/2002 | Moon et al. | |
| 2002/0191063 A1 | 12/2002 | Gelbart et al. | |
| 2003/0000476 A1* | 1/2003 | Matsunaga et al. | 118/719 |
| 2003/0175414 A1* | 9/2003 | Hayashi | 427/66 |
| 2003/0230980 A1 | 12/2003 | Forrest et al. | |
| 2004/0009304 A1 | 1/2004 | Pichler | |
| 2004/0048183 A1 | 3/2004 | Teshima | |
| 2004/0056244 A1 | 3/2004 | Marcus et al. | |
| 2004/0086631 A1 | 5/2004 | Han | |
| 2004/0202794 A1 | 10/2004 | Yoshida | |
| 2005/0005850 A1* | 1/2005 | Yamazaki | 118/719 |
| 2005/0190220 A1 | 9/2005 | Lim et al. | |
| 2005/0223994 A1* | 10/2005 | Blomiley et al. | 118/725 |
| 2005/0255249 A1 | 11/2005 | Schlatterbeck | |
| 2006/0012290 A1 | 1/2006 | Kang | |
| 2006/0115585 A1 | 6/2006 | Bulovic et al. | |
| 2007/0040877 A1 | 2/2007 | Kachi | |
| 2007/0058010 A1 | 3/2007 | Nagashima | |
| 2007/0098891 A1 | 5/2007 | Tyan et al. | |
| 2007/0134512 A1 | 6/2007 | Klubek et al. | |
| 2007/0286944 A1 | 12/2007 | Yokoyama et al. | |
| 2008/0174235 A1 | 7/2008 | Kim et al. | |
| 2008/0238310 A1 | 10/2008 | Forrest et al. | |
| 2008/0299311 A1 | 12/2008 | Shtein et al. | |
| 2008/0308037 A1 | 12/2008 | Bulovic et al. | |
| 2008/0311289 A1 | 12/2008 | Bulovic et al. | |
| 2008/0311296 A1 | 12/2008 | Shtein et al. | |
| 2008/0311307 A1 | 12/2008 | Bulovic et al. | |
| 2009/0031579 A1 | 2/2009 | Piatt et al. | |
| 2009/0045739 A1 | 2/2009 | Kho et al. | |
| 2009/0115706 A1 | 5/2009 | Hwang et al. | |
| 2009/0167162 A1 | 7/2009 | Lin et al. | |
| 2009/0220680 A1 | 9/2009 | Winters | |
| 2010/0055810 A1 | 3/2010 | Sung et al. | |
| 2010/0079513 A1 | 4/2010 | Taira et al. | |
| 2010/0171780 A1 | 7/2010 | Madigan et al. | |
| 2010/0188457 A1 | 7/2010 | Madigan et al. | |
| 2010/0201749 A1 | 8/2010 | Somekh et al. | |
| 2010/0310424 A1 | 12/2010 | Rose et al. | |
| 2011/0008541 A1 | 1/2011 | Madigan et al. | |
| 2011/0057171 A1 | 3/2011 | Adamovich et al. | |
| 2011/0181644 A1 | 7/2011 | Bulovic et al. | |
| 2011/0267390 A1 | 11/2011 | Bulovic et al. | |
| 2011/0293818 A1 | 12/2011 | Madigan et al. | |

FOREIGN PATENT DOCUMENTS

| | | |
|---|---|---|
| JP | 08-216401 | 8/1996 |
| JP | 09-248918 | 9/1997 |
| JP | 2002-069650 | 3/2002 |
| JP | 2005-286069 | 10/2005 |
| JP | 2006-123551 | 5/2006 |
| JP | 2006-150900 | 6/2006 |
| JP | 2007-076168 | 3/2007 |
| JP | 2007-095343 | 4/2007 |
| JP | 2007-299616 | 11/2007 |
| JP | 05-255630 | 10/2009 |
| KR | 100232852 | 12/1999 |
| KR | 10-2008-0060111 | 7/2007 |
| WO | WO 2005/090085 | 9/2005 |

OTHER PUBLICATIONS

Forrest, Stephen R., "The Path to Ubiquitous and Low-cost Organic Electronic Appliances on Plastic," *Nature*, Apr. 29, 2004, vol. 428, 8 pages.

Leblanc et al., "Micromachined Printheads for the Evaporative Patterning of Organic Materials and Metals," *Journal of Microelectromechanical Systems*, Apr. 2007, vol. 16, No. 2, 7 pp. 1-139.

Lindermann et al., "Thermal Bubble Jet Printhead with Integrated Nozzle Plate," *NIP20: International Conference on Digital Printing Technologies*, Oct. 2004, pp. 834-839.

Chen, Jianglong, "Novel Patterning Techniques for Manufacturing Organic and Nanostructured Electronics," *M.S. Materials Science and Engineering*, Massachusetts Institute of Technology, 2003, pp. 1-206.

Chen, Jingkuang et al., "A High-Resolution Silicon Monolithic Nozzle Array for Inkjet Printing," *IEEE Transactions on Electron Devices*, vol. 44, No. 9, Sep. 1997, pp. 1401-1409.

Chen et al., "Evaporative Deposition of Molecular Organics in Ambient with a Molecular Jet Printer," *Digital Fabrication*, Sep. 2006, pp. 63-65.

Chen et al., "Ambient Environment Patterning of Organic Thin Films by a Second Generation Molecular Jet (MoJet) Printer," *Progress Report 2006-2007*, Oct. 2007, pp. 26-6; 26-7.

International Search Report issued on Dec. 15, 2010 for PCT Application No. PCT/US10/020144.

International Search Report issued on Sep. 2, 2010 for PCT Application No. PCT/US10/033315.

International Search Report and Written Opinion issued on Mar. 24, 2011 for PCT Application No. PCT/US10/058145.

International Preliminary Report on Patentability issued on Dec. 17, 2009 for PCT Application No. PCT/US08/66975.

International Preliminary Report on Patentability issued on Dec. 7, 2009 for PCT Application No. PCT/US08/066991.

International Preliminary Report on Patentability issued on Dec. 17, 2009 for PCT Application No. PCT/US08/67002.
EP Examination Report dated Jul. 30, 2010 issued for EP Patent Application 08771068.7.
CN Office Action dated Oct. 12, 2010 issued for CN Patent Application 200880020197.8.
CN Second Office Action dated Jun. 22, 2011 issued for CN Patent Application 200880020197.8.
EP Examination Report dated Jul. 13, 2010 issued for EP Patent Application 08771094.3.
CN Office Action dated Dec. 17, 2010 issued for CN Patent Application 200880020151.6.
CN Office Action dated Jan. 12, 2011 issued for CN Patent Application 200880019990.6.
EP Examination Report dated Jul. 13, 2010 issued for EP Patent Application 08771084.4.
Chin, Byung Doo, "Effective Hole Transport Layer Structure for Top Emitting Devices Based on Laser Transfer Patterning," *Journal of Physics D: Applied Physics*, 2007, vol. 40, pp. 5541-5546.
Elwenspoek et al., "Silicon Micromachining," Aug. 2004, Cambridge University, Cambridge, U.K. ISBN 0521607671. [Abstract].
C. Ducso, et al. "Porous Silicon Bulk Micromachining for Thermally Isolated Membrane Formation," *Sensors and Actuators A*, 1997, vol. 60, pp. 235-239.
C. Tsamis, et al. "Thermal Properties of Suspended Porous Microhotplates for Sensor Applications," *Sensor and Actuators B*, 2003, vol. 95, pp. 78-82.

J. Lee, et al. "Differential Scanning Calorimeter Based on Suspended Membrane Single Crystal Silicon Microhotplate," *Journal of Microelectromechanical Systems*, Dec. 2008, vol. 17, No. 6, pp. 1513-1525.
J. C. Belmonte, et al. "High-temperature Low-power Performing Micromachined Suspended Micro-hotplate for Gas Sensing Applications<" *Sensors and Actuators B*, 2006, vol. 114, pp. 826-835.
G.S. Chung, "Fabrication and Characterization of Micro-heaters with Low-power Consumption using SOI membrane and Trench Structures," *Sensors and Actuators A*, 2004, vol. 112, pp. 55-60.
Geffroy et al., "Organic Light-emitting Diode (OLED) Technology: Material Devices and Display Technologies," *Polymer International*, Jun. 2006, vol. 55, pp. 572-582. (Abstract only).
Huang et al., "Reducing Blueshift of Viewing Angle for Top-Eimtting Organic Light-Emitting Devices," Dec. 6, 2008, 3 pages.
J. Lee, et al. "Cavity Effects on Light Extraction in Organic Light emitting Devices," *Applied Physics Letters*, Jan. 24, 2008, vol. 92, No. 3, 5 pages.
S.H. Kim et al. "Fabrication and Characterization of co-planar type MEMS Structures on SiO2/Si3N4 Membrane for Gas Sensors with Dispensing Method Guided by Micromachined Wells," Journal of Eletroceramics, Jun. 27, 2005, vol. 17, No. 2-4, pp. 995-998.

\* cited by examiner

METHOD AND APPARATUS FOR LOAD-LOCKED PRINTING

The application claims the filing-date priority of Provisional Application No. 61/142,575, filed Jan. 5, 2009, the disclosure of which is incorporated herein in its entirety; the application is a continuation-in-part U.S. patent application Ser. No. 12/139,391 filed Jun. 13, 2008, the disclosure of which is incorporated herein in its entirety.

BACKGROUND

1. Field of the Invention

The disclosure relates to a method and apparatus for efficient deposition of a patterned film on a substrate. More specifically, the disclosure relates to a method and apparatus for supporting and transporting a substrate on gas bearing during thermal jet printing of material on a substrate.

2. Description of Related Art

The manufacture of organic light emitting devices (OLEDs) requires depositing one or more organic films on a substrate and coupling the top and bottom of the film stack to electrodes. The film thickness is a prime consideration. The total layer stack thickness is about 100 nm and each layer is optimally deposited uniformly with an accuracy of better than .+-.0.1 nm. Film purity is also important. Conventional apparatuses form the film stack using one of two methods: (1) thermal evaporation of organic material in a relative vacuum environment and subsequent condensation of the organic vapor on the substrate; or, (2) dissolution of organic material into a solvent, coating the substrate with the resulting solution, and subsequent removal of the solvent.

Another consideration in depositing the organic thin films of an OLED is placing the films precisely at the desired location on the substrate. There are two conventional technologies for performing this task, depending on the method of film deposition. For thermal evaporation, shadow masking is used to form OLED films of a desired configuration. Shadow masking techniques require placing a well-defined mask over a region of the substrate followed by depositing the film over the entire substrate area. Once deposition is complete, the shadow mask is removed. The regions exposed through the mask define the pattern of material deposited on the substrate. This process is inefficient as the entire substrate must be coated, even though only the regions exposed through the shadow mask require a film. Furthermore, the shadow mask becomes increasingly coated with each use, and must eventually be discarded or cleaned. Finally, the use of shadow masks over large areas is made difficult by the need to use very thin masks (to achieve small feature sizes) that make said masks structurally unstable. However, the vapor deposition technique yields OLED films with high uniformity and purity and excellent thickness control.

For solvent deposition, ink jet printing can be used to deposit patterns of OLED films. Ink jet printing requires dissolving organic material into a solvent that yields a printable ink. Furthermore, ink jet printing is conventionally limited to the use of single layer OLED film stacks, which typically have lower performance as compared to multilayer stacks. The single-layer limitation arises because printing typically causes destructive dissolution of any underlying organic layers. Finally, unless the substrate is first prepared to define the regions into which the ink is to be deposited, a step that increases the cost and complexity of the process, ink jet printing is limited to circular deposited areas with poor thickness uniformity as compared to vapor deposited films. The material quality is also lower due to structural changes in the material that occur during the drying process and due to material impurities present in the ink. However, the ink jet printing technique is capable of providing patterns of OLED films over very large areas with good material efficiency.

No conventional technique combines the large area patterning capabilities of ink jet printing with the high uniformity, purity, and thickness control achieved with vapor deposition for organic thin films. Because ink jet processed single layer OLED devices continue to have inadequate quality for widespread commercialization, and thermal evaporation remains impractical for scaling to large areas, it is a major technological challenge for the OLED industry to develop a technique that can offer both high film quality and cost-effective large area scalability.

Manufacturing OLED displays may also require the patterned deposition of thin films of metals, inorganic semiconductors, and/or inorganic insulators. Conventionally, vapor deposition and/or sputtering have been used to deposit these layers. Patterning is accomplished using prior substrate preparation (e.g., patterned coating with an insulator), shadow masking as described above, and when a fresh substrate or protective layers are employed, conventional photolithography. Each of these approaches is inefficient as compared to the direct deposition of the desired pattern, either because it wastes material or requires additional processing steps. Thus, for these materials as well there is a need for a method and apparatus for depositing high-quality, cost effective, large area scalable films.

Certain applications of thermal jet printing require non-oxidizing environment to prevent oxidation of the deposited materials or associated inks. In a conventional method, a sealed nitrogen tent is used to prevent oxidation. Conventional systems use a floating system to support and move the substrate. A floatation system can be defined as a bearing system of alternative gas bearings and vacuum ports. The gas bearings provide the lubricity and non-contacting support for the substrate, while the vacuum supports the counter-force necessary to strictly control the height at which the relatively light-weight substrate floats. Since high-purity nitrogen gas can be a costly component of the printing system, it is important to minimize nitrogen loss to the ambient.

Accordingly, there is a need for load-locked printing system which supports a substrate on gas bearings while minimizing system leakage and nitrogen loss.

SUMMARY

The disclosure relates to a method and apparatus for preventing oxidation or contamination during a thermal jet printing operation. The thermal jet printing operation may include OLED printing and the printing material may include suitable ink composition. In an exemplary embodiment, the printing process is conducted at a load-locked printer housing having one or more chambers. Each chamber is partitioned from the other chambers by physical gates or fluidic curtains. A controller coordinates transportation of a substrate through the system and purges the system by timely opening appropriate gates. The substrate may be transported using gas bearings which are formed using a plurality of vacuum and gas input portals. The controller may also provide a non-oxidizing environment within the chamber using a gas similar to, or different from, the gas used for the gas bearings. The controller may also control the printing operation by energizing the print-head at a time when the substrate is positioned substantially thereunder.

In one embodiment, the disclosure relates to a method for printing a film of OLED material on a substrate by (i) receiving the substrate at an inlet chamber; (ii) flooding the inlet load-locked chamber with a noble gas and sealing the inlet chamber; (iii) directing at least a portion of the substrate to a print-head chamber and discharging a quantity of OLED material from a thermal jet discharge nozzle onto the portion of the substrate; (iv) directing the substrate to an outlet chamber; (v) partitioning the print-head chamber from the outlet chamber; and (vi) unloading the print-head from the outlet chamber. In one embodiment of the invention, the print-head chamber pulsatingly delivers a quantity of material from a thermal jet discharge nozzle to the substrate.

In another embodiment, the disclosure relates to a method for depositing a material on a substrate. The method includes the steps of: (i) receiving the substrate at an inlet chamber; (ii) flooding the inlet chamber with a chamber gas and sealing the inlet chamber; (iii) directing at least a portion of the substrate to a print-head chamber and discharging a quantity of material from a thermal jet discharge nozzle onto the portion of the substrate; (iv) directing the substrate to an outlet chamber; (v) partitioning the print-head chamber from the outlet chamber; and (vi) unloading the print-head from the outlet chamber. The print-head chamber pulsatingly delivers a quantity of material from a thermal jet discharge nozzle to the substrate.

In another embodiment, the disclosure relates to a load-locked printing apparatus, comprising an inlet chamber for receiving a substrate, the inlet chamber having a first partition and a second partition; a print-head chamber in communication with the inlet chamber, the print-head chamber having a discharge nozzle for pulsatingly metering a quantity of ink onto a substrate, the second partition separating the print-head chamber from the inlet chamber; an outlet chamber in communication with the print-head chamber through a third partition, the outlet chamber receiving the substrate from print head chamber and exiting the substrate from a fourth chamber. In a preferred embodiment, the inlet chamber, the print-head chamber and the outlet chamber provide an inert gas environment while the discharge nozzle pulsatingly meters the quantity of ink onto the substrate. Although the implementation of the invention are not limited thereto, the inert gas environment can be a noble gas (e.g. argon, helium, nitrogen or hydrogen).

In still another embodiment, the disclosure relates to a load-locked thermal jet printing system. The system includes a housing with an inlet partition and an outlet partition. The housing defines a print-head chamber for depositing a quantity of ink onto a substrate. The housing also includes an inlet partition and an outlet partition for receiving and dispatching the substrate. A gas input provides a first gas to the housing. A controller communicates with the print-head chamber, the gas input and the inlet and outlet partitions. The controller comprises a processor circuit in communication with a memory circuit, the memory circuit instructing the processor circuit to (i) receive the substrate at the inlet partition; (ii) purge the housing with the first gas; (iii) direct the substrate to a discharge nozzle at the print-head chamber; (iv) energize the thermal jet discharge nozzle to pulsatingly deliver a quantity of film material from the discharge nozzle onto the substrate; and (v) dispatch the substrate from the housing through the outlet partition.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

Figure 1:
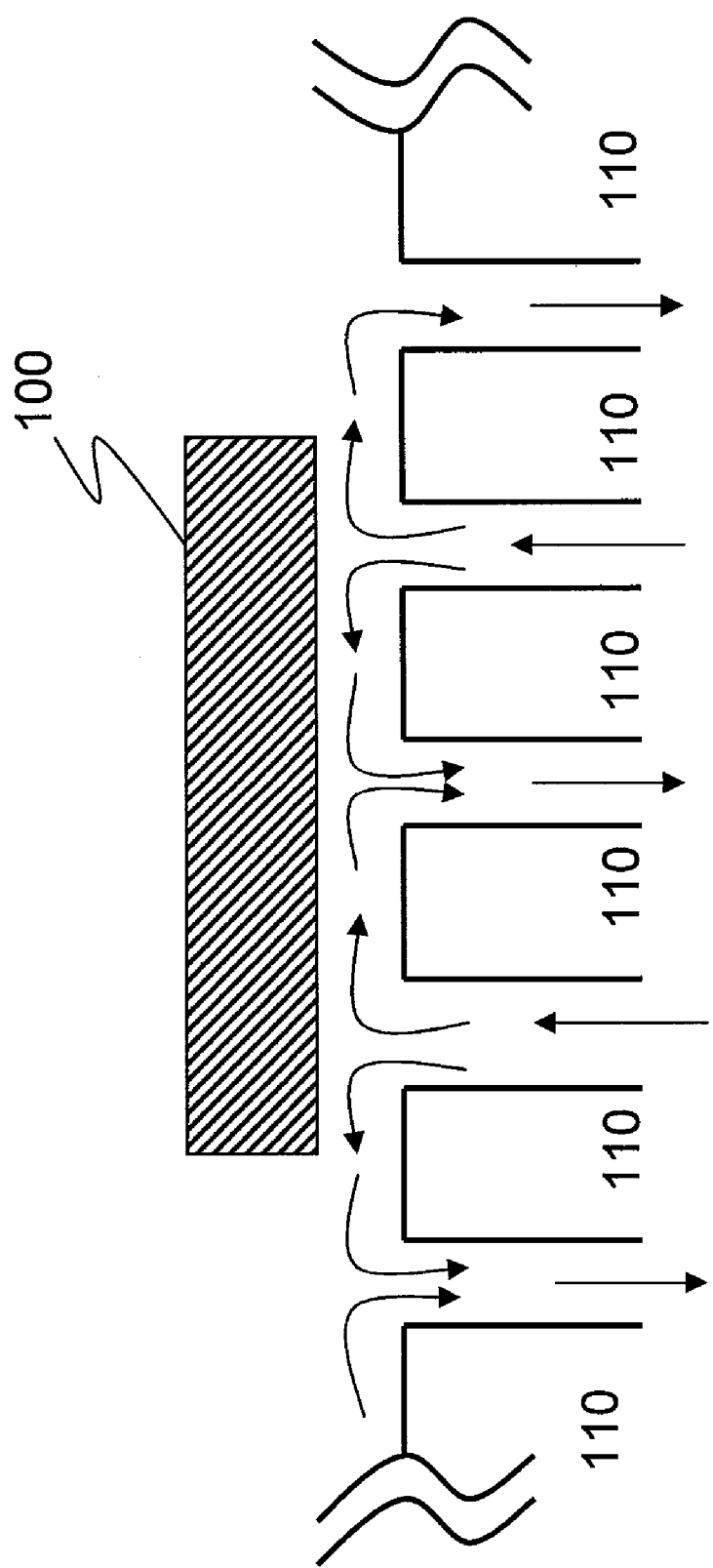
FIG. 1 is a schematic representation of a conventional substrate floatation system.

FIG. 1 is a schematic representation of a conventional substrate floatation system. More specifically, FIG. 1 shows a portion of a flotation system in which substrate 100 is supported by air bearings. The air bearings are shown schematically as arrows entering and leaving between baffles 110. The substrate floatation system of FIG. 1 is typically housed in a sealed chamber (not shown). The chamber includes multiple vacuum outlet ports and gas bearing inlet ports, which are typically arranged on a flat surface. Substrate 100 is lifted and kept off a hard surface by the pressure of a gas such as nitrogen. The flow out of the bearing volume is accomplished by means of multiple vacuum outlet ports. The floating height is typically a function of the gas pressure and flow. In principle, any gas can be utilized for such a substrate floatation system; however, in practice it is preferable to utilize a floatation gas that is inert to the materials that come into contact with the gas. As a result, it is conventional to use noble gases (e.g., nitrogen, argon, and helium) as they usually demonstrate sufficient inertness.

The floatation gas is an expensive component of the substrate floatation system. The cost is compounded when the printing system calls for substantially pure gas. Thus, it is desirable to minimize any gas loss to the environment.

Figure 2:
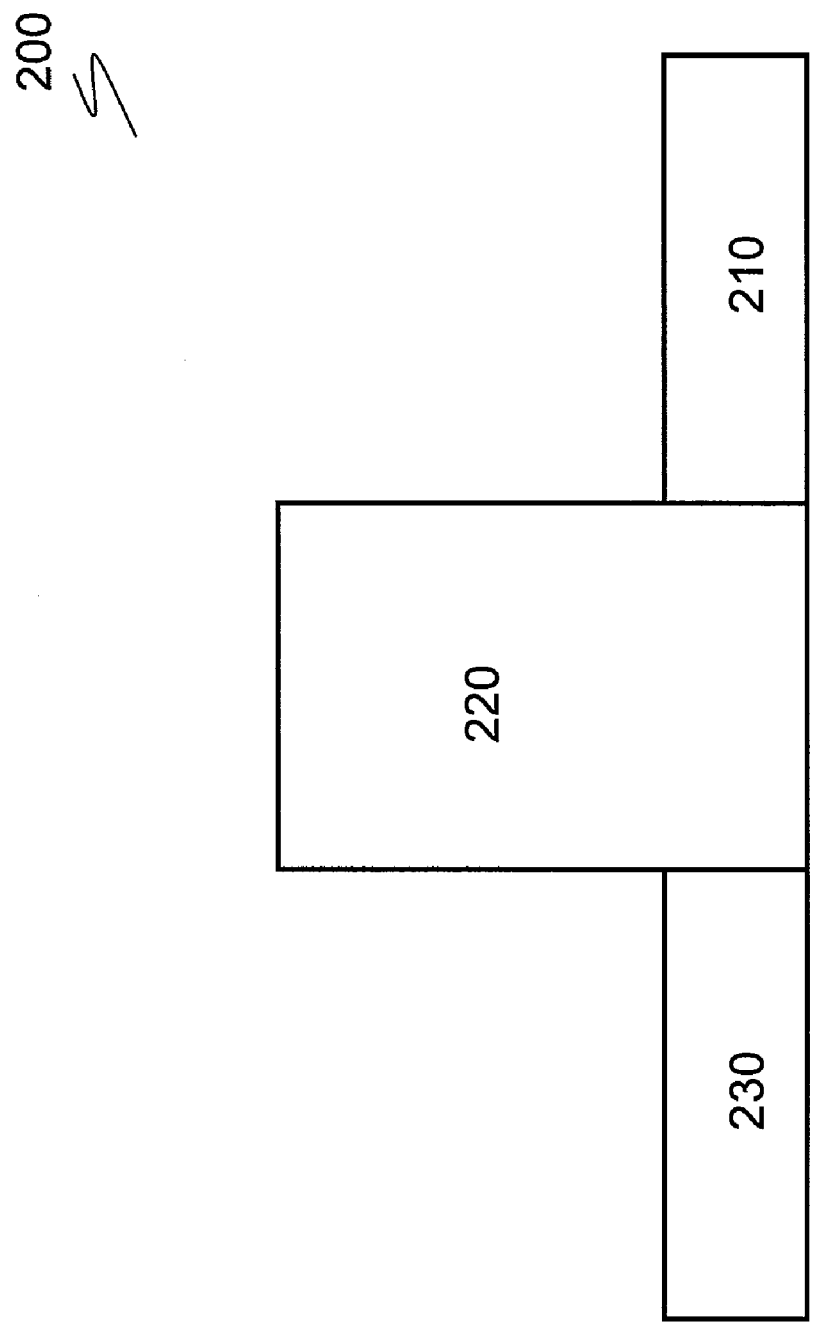
FIG. 2 is a schematic representation of an exemplary load-locked printing housing.

FIG. 2 is a simplified representation of an exemplary load-locked printing housing according to one embodiment of the disclosure. Housing 200 is divided into three chambers, including inlet chamber 210, print-head chamber 220 and outlet chamber 230. As will be discussed, each chamber is separated from the rest of housing 200 through a gate or a partition. In one embodiment of the disclosure the gates or partitions substantially seal the chambers from the ambient environment and from the rest of housing 200. In another embodiment of the disclosure (not shown), chamber 230 is not included in housing 200, and chamber 210 is utilized as both an inlet and an outlet chamber.

Figure 3:
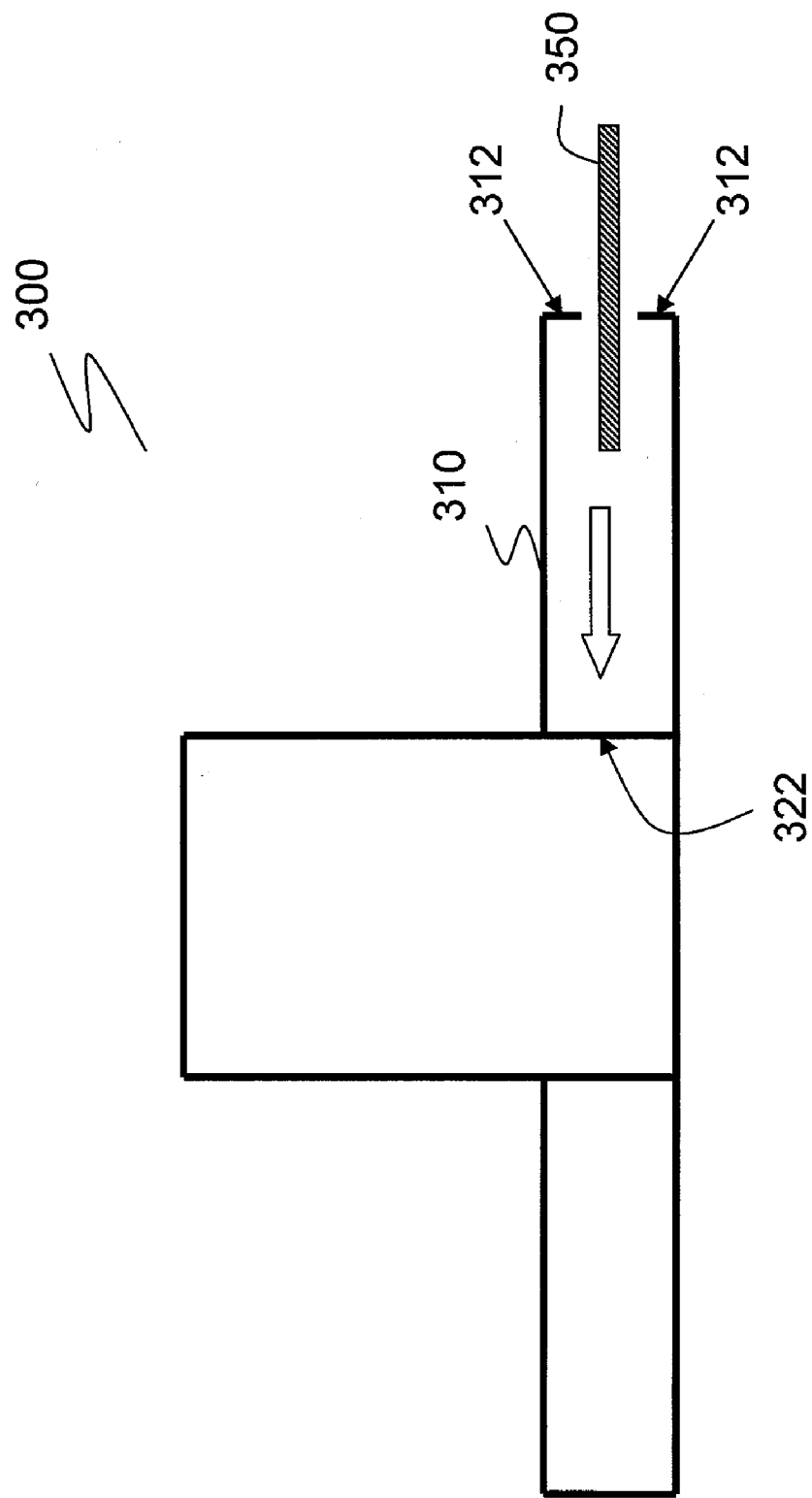
FIG. 3 is a schematic representation of the load-locked printing housing of FIG. 2 receiving a substrate.

FIG. 3 is a schematic representation of the load-locked printing housing of FIG. 2 receiving a substrate. During operation, substrate 350 is received at inlet chamber 310 through inlet gates 312. Inlet gates 312 can comprise a variety of options, including single or multiple moving gates. The gates can also be complemented with an air curtain (not shown) for minimizing influx of ambient gases into inlet chamber 310. Alternatively, the gates can be replaced with air curtains acting as a partition. Similar schemes can be deployed in all gates of the housing. Once substrate 350 is received at inlet chamber 310, inlet gates 312 close. The substrate can then be detained at inlet chamber 310. At this time, the inlet chamber can be optionally purged from any ambient gases and refilled with the desired chamber gas, which is conventionally selected to be the same as the floatation gas, e.g. pure nitrogen or other noble gases. During the purging process, print-head inlet gate 322 as well as inlet gate 312 remain closed. Print-head inlet gate 322 can define a physical or a gas curtain. Alternatively, print-head inlet gate 322 can define a physical gate similar to inlet gate 312.

Figure 4:
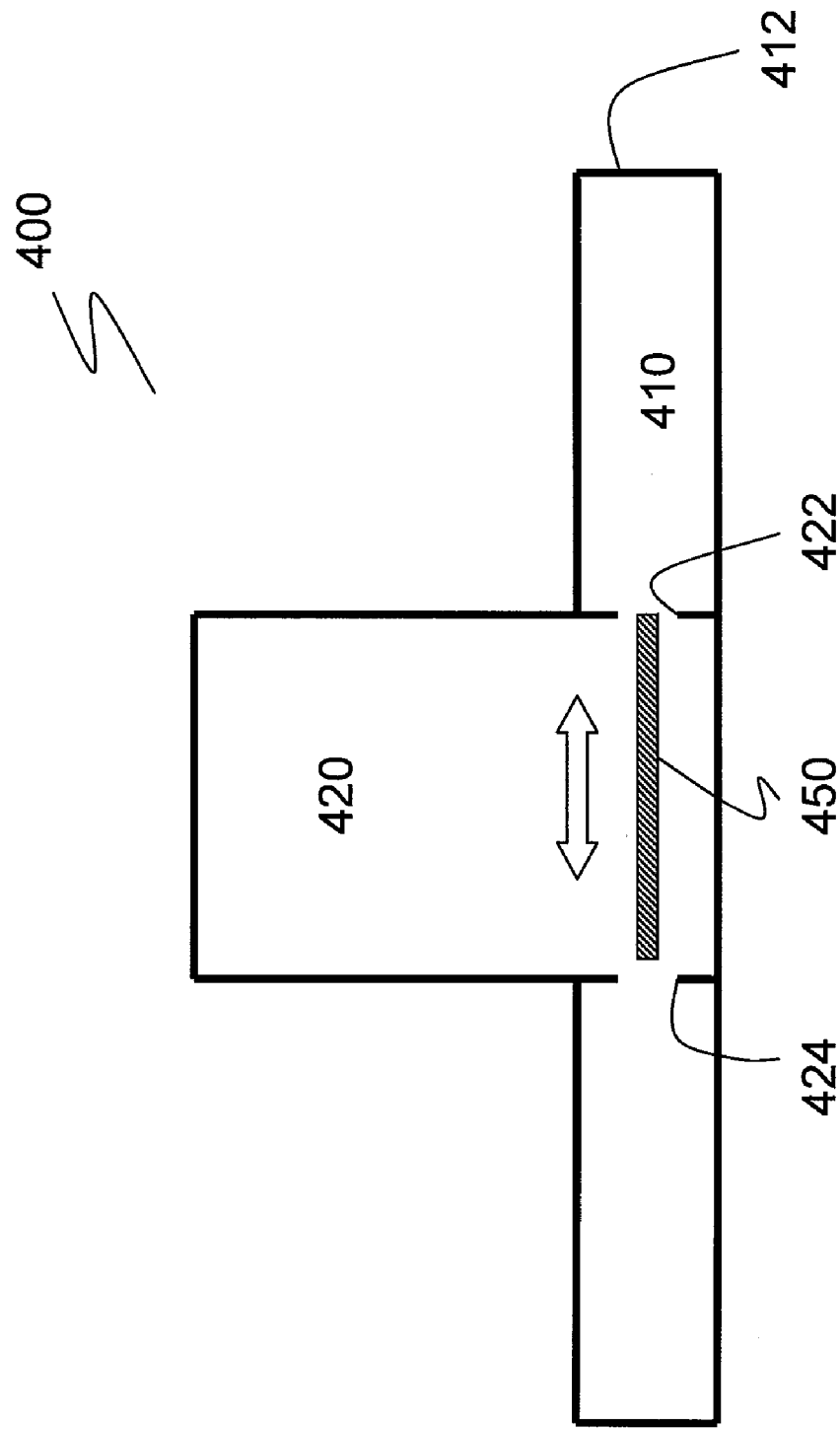
FIG. 4 schematically shows the substrate received at the print-head chamber of the housing.

FIG. 4 schematically shows the substrate received at the print-head chamber of the housing. Air bearings can be used to transport substrate 450 from inlet chamber 410 through print-head inlet gate 422 and into print-chamber 420. Print-head chamber 420 houses the thermal jet print-head, and optionally, the ink reservoir. The printing process occurs at print-head chamber 420. In one implementation of the invention, once substrate 450 is received at print-head chamber 420, print-head gates 422 and 424 are closed during the printing process. Print-head chamber can be optionally purged with a chamber gas (e.g., high purity nitrogen) for further purification of the printing environment. In another implementation, substrate 450 is printed while gates 422 and 424 remain open. During the printing operation, substrate 450 can be supported by air bearings. The substrate's location in relation to housing 400 can be controlled using a combination of air pressure and vacuum, such as those shown in FIG. 1. In an alternative embodiment, the substrate is transported through housing 400 using a conveyer belt.

Figure 5:
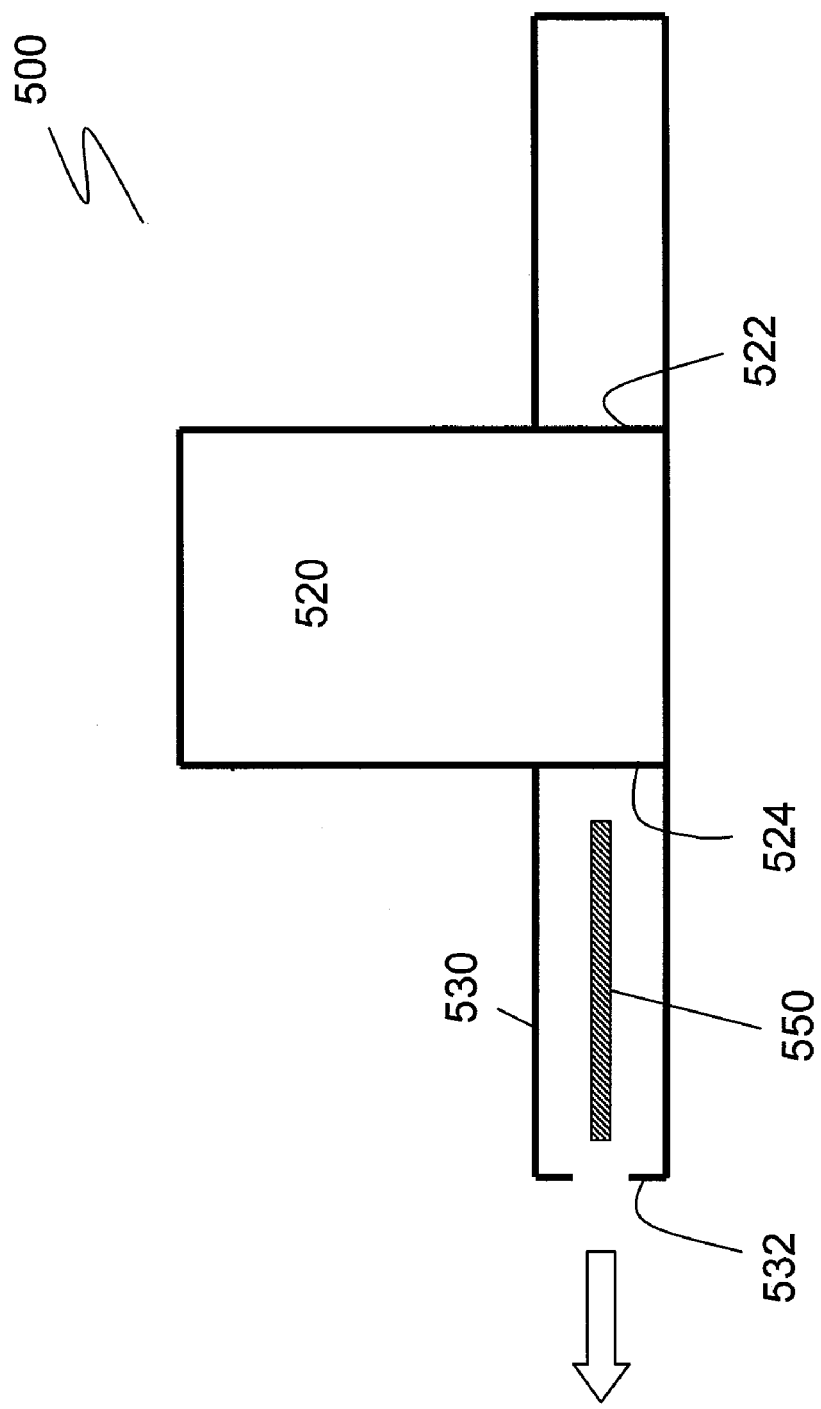
FIG. 5 schematically shows the completion of the printing process of FIGS. 3 and 4.

Once the printing process is complete, the substrate is transported to the outlet chamber as shown in FIG. 5. Here, print-head gates 522 and 524 are closed to seal off outlet chamber 530 from the remainder of housing 500. Outlet gate 532 is opened to eject substrate 550 as indicated by the arrow. The process shown in FIGS. 3-5 can be repeated to continuously print OLED materials on multiple substrates. Alternatively, gates 512, 522, 524 and 532 can be replaced with air curtains to provide for continuous and uninterrupted printing process. In another embodiment of the disclosure, once the printing process is complete, the substrate is transported back to the inlet chamber 310 through gate 322, where gate 322 can be subsequently sealed off and gate 312 opened to eject the substrate. In this embodiment, inlet chamber 310 functions also as the outlet chamber, functionally replacing outlet chamber 530.

The print-head chamber houses the print-head. In a preferred embodiment, the print-head comprises an ink chamber in fluid communication with nozzle. The ink chamber receives ink, comprising particles of the material to be deposited on the substrate dissolved or suspended in a carrier liquid, in substantially liquid form from a reservoir. The ink head chamber then meters a specified quantity of ink onto an upper face of a thermal jet discharge nozzle having a plurality of conduits such that upon delivery to the upper face, the ink flows into the conduits. The thermal jet discharge nozzle is activated such that the carrier liquid is removed leaving behind in the conduits the particles in substantially solid form. The thermal jet discharge nozzle is then further pulsatingly activated to deliver the quantity of material in substantially vapor form onto the substrate, where it condenses into substantially solid form.

Figure 6:
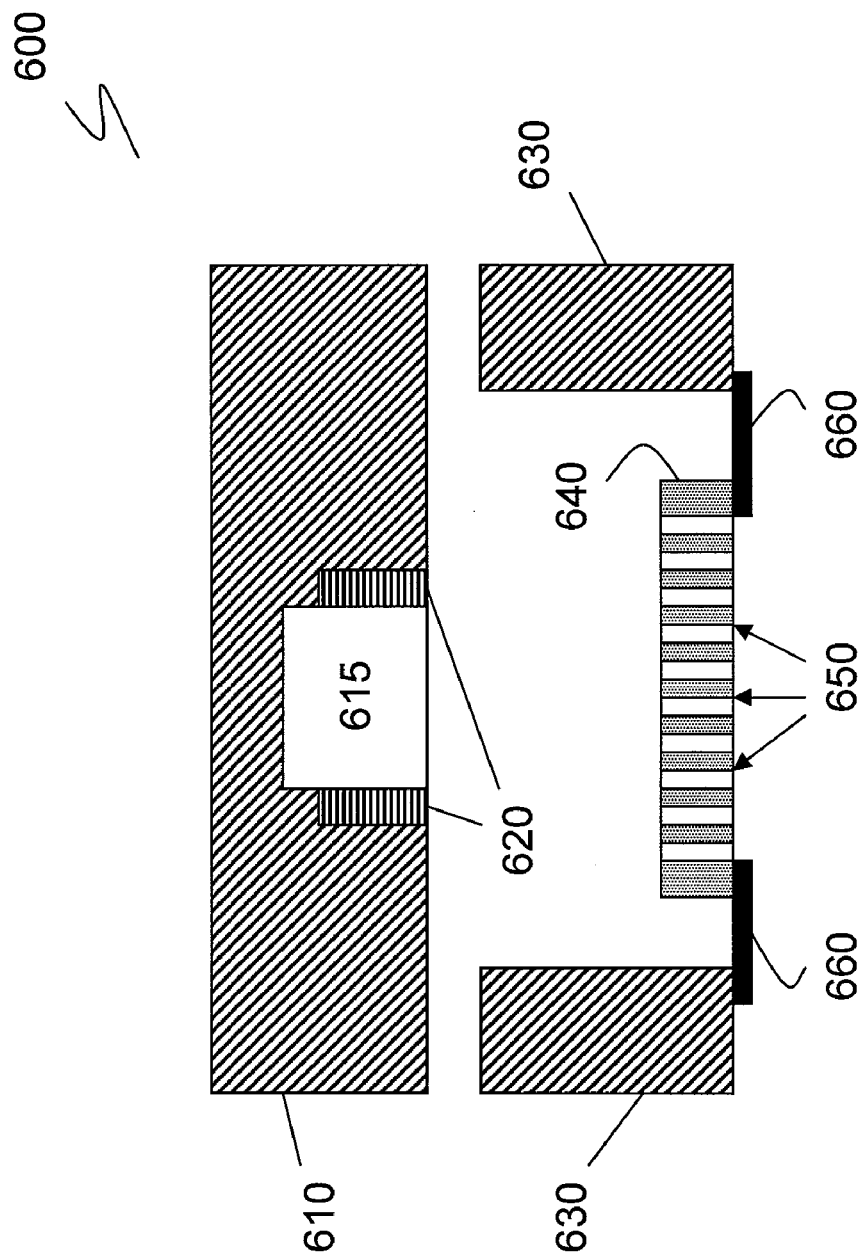
FIG. 6 is a schematic representation of a print-head for use with the load-locked housing of FIG. 2.

FIG. 6 is a schematic representation of a thermal jet print-head for use with the load-locked housing of FIG. 2. Print-head 600 includes ink chamber 615 which is surrounded by top structure 610 and energizing element 620. Ink chamber 615 is in liquid communication with an ink reservoir (not shown). Energizing element 620 can comprise a piezoelectric element or a heater. Energizing element 620 is energized intermittently to dispense a metered quantity of ink, optionally in the form of a liquid droplet, on the top surface of the thermal jet discharge nozzle 640.

Bottom structure 630 supports nozzle 640 through brackets 660. Brackets 660 can include and integrated heating element. The heating element is capable of instantaneously heating thermal jet discharge nozzle 640 such that the ink carrier liquid evaporates from the conduits 650. The heating element is further capable of instantaneously heating the thermal jet discharge nozzle 650 such that substantially solid particles in the discharge nozzle are delivered from the conduits in substantially vapor form onto the substrate, where they condense into substantially solid form.

Print-head 600 operates entirely within the print-head chamber 220 and housing 200 of FIG. 2. Thus, for properly selected chamber and floatation gases (e.g. high purity nitrogen in most instances), the ink is not subject to oxidation during the deposition process. In addition, the load-locked housing can be configured to receive a transport gas, such as a noble gas, for carrying the material from the thermal jet discharge nozzle 640 onto the substrate surface. The transport gas may also transport the material from the thermal jet discharge nozzle 640 to the substrate by flowing through conduits 650. In a preferred embodiment, multiple print-heads 600 are arranged within a load-locked print system as an array. The array can be configured to deposit material on a substrate by activating the print-heads simultaneously or sequentially.

Figure 7:
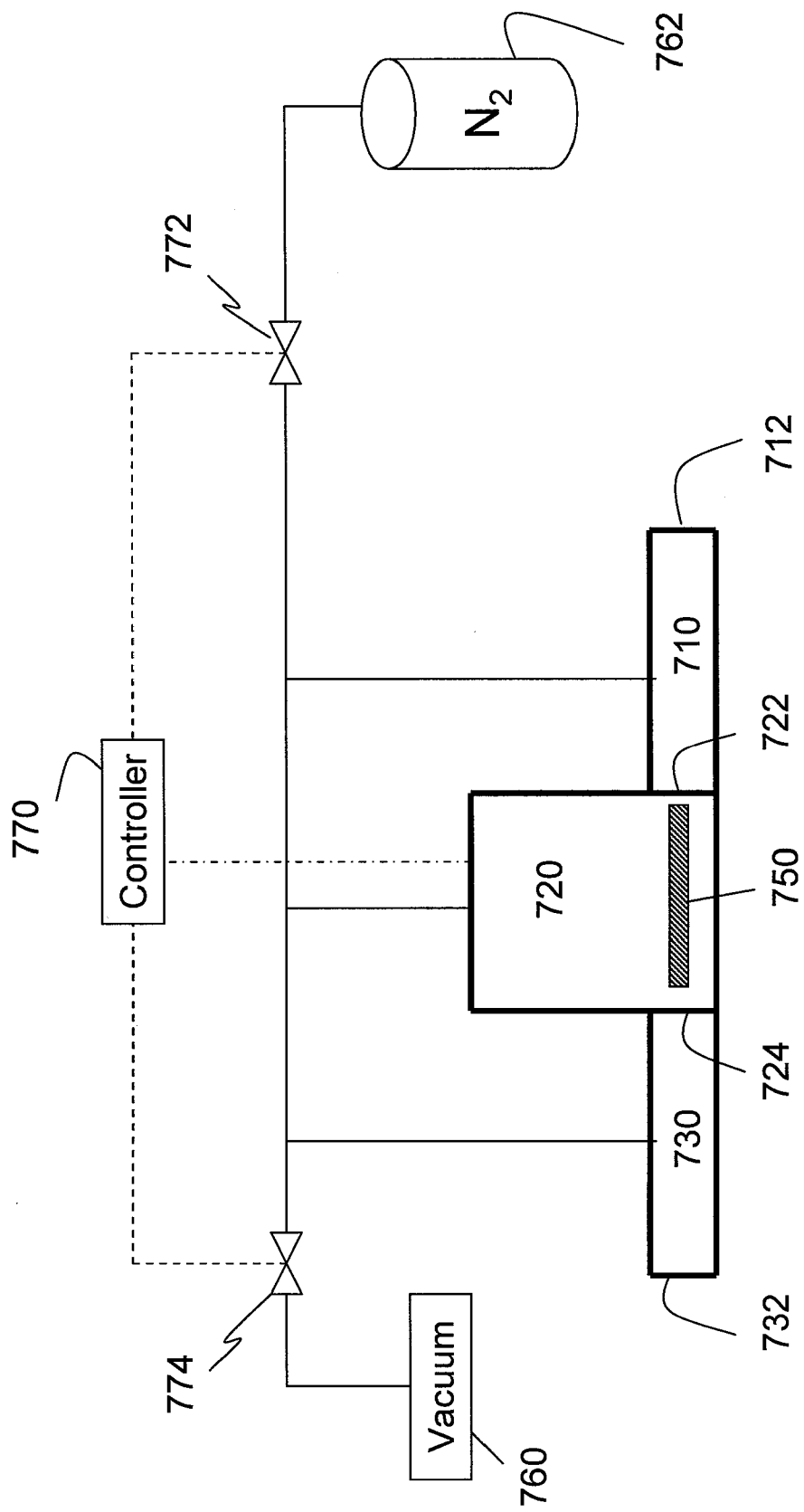
FIG. 7 is an exemplary load-locked system according to an embodiment of the invention.

FIG. 7 is an exemplary load-locked system according to an embodiment of the invention. Load-locked system of FIG. 7 includes a housing with inlet chamber 710, print-head chamber 720 and outlet chamber 730. Inlet chamber 710 communicates through gates 712 and 722. Print-head chamber 720 receives substrate 750 from the inlet chamber and deposits organic LED material thereon as described in relation to FIG. 6. Gate 724 communicates substrate 750 to outlet chamber 730 after the printing process is completed. The substrate exists outlet chamber 730 through gate 732.

Vacuum and pressure can be used to transport substrate 750 through the load-locked system of FIG. 7. To control transporting the substrate, controller 770 communicates with nitrogen source 762 and vacuum 760 through valves 772 and 774, respectively. Controller 770 comprises one or more processor circuits (not shown) in communication with one or more memory circuit (not shown). The controller also communicates with the load-locked housing and ultimately with the print nozzle. In this manner, controller 770 can coordinate opening and closing gates 712, 722, 724 and 732. Controller 770 can also control ink dispensing by activating the piezoelectric element and/or the heater (see FIG. 6). The substrate can be transported through the load-locked print system through air bearings or by a physical conveyer under the control of the controller.

In an exemplary operation, a memory circuit (not shown) of controller 770 provides instructions to a processor circuit (not shown) to: (i) receive the substrate at the inlet partition; (ii) purge the housing with the first gas; (iii) direct the substrate to a discharge nozzle at the print-head chamber; (iv) energize the discharge nozzle to pulsatingly deliver a quantity of material from the thermal jet discharge nozzle onto the substrate; and (v) dispatch the substrate from the housing through the outlet partition. The first gas and the second gas can be different or identical gases. The first and/or the second gas can be selected from the group comprising nitrogen, argon, and helium.

Controller 770 may also identify the location of the substrate through the load-locked print system and dispense ink from the print-head only when the substrate is at a precise location relative to the print-head.

Another aspect of the invention relates to registering the substrate relative to the print-head. Printing registration is defined as the alignment and the size of one printing process with respect to the previous printing processes performed on the same substrate. In order to achieve appropriate registration, the print-head and the substrate need to be aligned substantially identically in each printing step. In one implementation of the invention, the substrate is provided with horizontal motion (i.e., motion in the x direction) and the print-head is provided with another horizontal motion (i.e., motion in they direction). The x and y directions may be orthogonal to each other. With this arrangement, the movement of the print-head with respect to the substrate can be defined with a combination of these two horizontal directions.

When the substrate is loaded onto a load-locked system, the areas to be printed are usually not perfectly aligned in the x and y directions of the system. Thus, there is a need for detecting the misalignment, determining the required corrections to the motion of the print-head relative to the substrate and applying the corrections.

According to one embodiment of the invention, the pattern or the previous printing is detected using a pattern recognition system. This pattern can be inherent in the previous printing or may have been added deliberately (i.e., fiducials) for the pattern recognition step. By means of its recognition of the pattern, the misalignment of the substrate to the printing system's motion, direction or axis can be determined. This manifests itself as a magnification misalignment, a translational misalignment and an angular misalignment.

Figure 8:
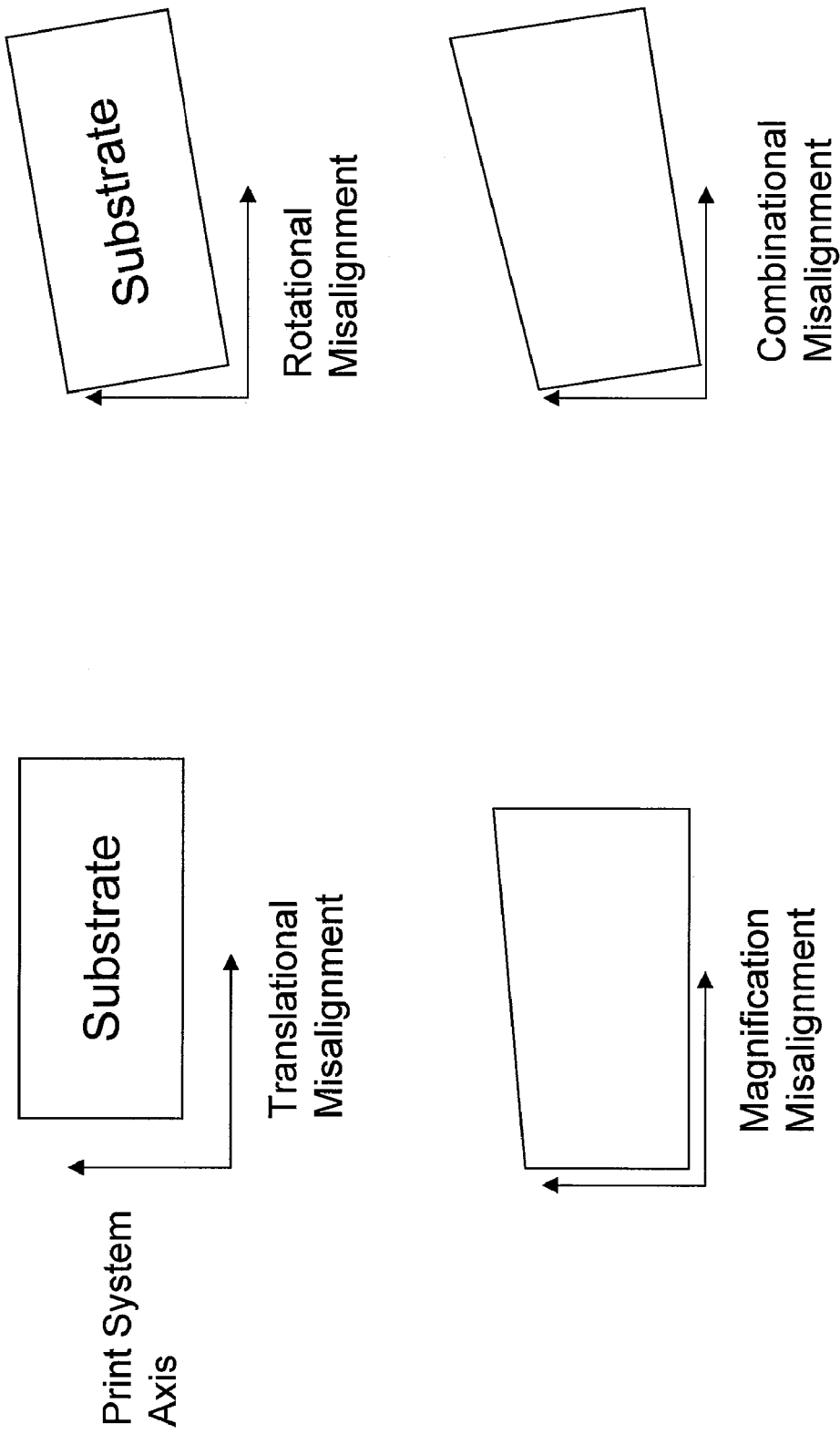
FIG. 8 shows several types of substrate misalignment within the print system.

FIG. 8 shows several types of substrate misalignment within the print system, including translational misalignment, rotational misalignment, magnification misalignment and combinational misalignment. For each print-head scan motion relative to the substrate, the pattern recognition system will look for and find/recognize the desired pattern. The pattern recognition system can optionally be integrated with the controller (see FIG. 7). The pattern recognition system will look for and find/recognize the desired pattern. The pattern recognition system will provide the degree of error/misalignment in the x and y directions to the system's controller, which will then reposition the print-head and substrate to eliminate the error/misalignment. This means that for several motions of the print-head with respect to the substrate, the motion control system will check for misalignment and make the necessary corrections.

Figure 9:
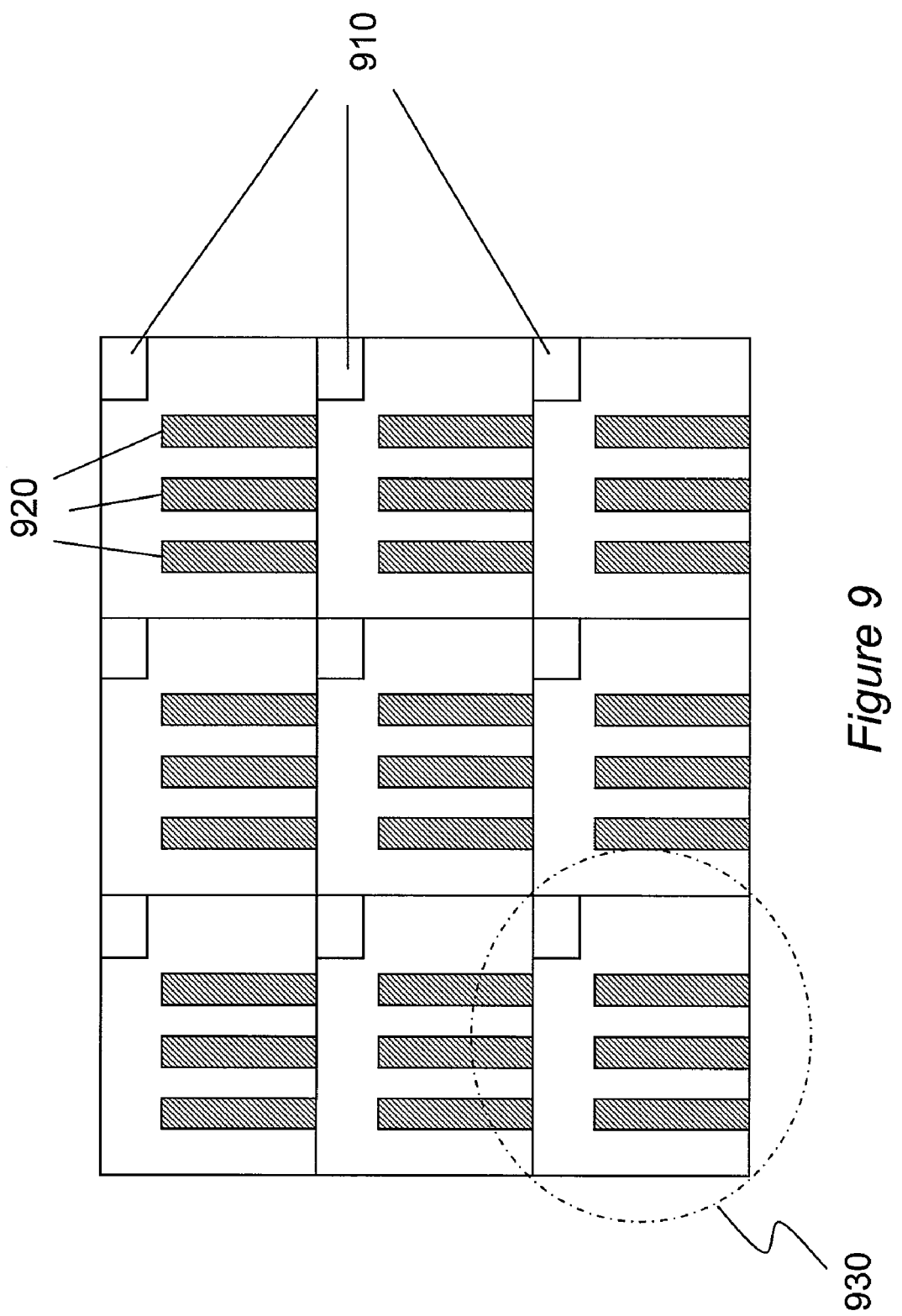
FIG. 9 shows a substrate pattern including fiducials and initial locus of area viewed by a camera or other imaging devices.

Alternatively, an initial scan of the entire substrate can be performed by the pattern recognition system utilizing the x and y motions available in the printing system. FIG. 9 shows a substrate pattern including fiducials and initial locus of area viewed by a camera or other imaging devices. In FIG. 9, fiducials or alignment targets are identified as boxes 910 in each replicated "pixel." Each pixel in this example, and in many OLED applications, comprises three sub-pixels each having a distinct color: red, green, and blue (RGB). The camera or the pattern recognition device initially focuses on an area of the substrate identified by circle 930. Once the amount of misalignment is determined, the motion control system can compensate for the misalignment by causing the x and the y directions to move in a rotated and translated set of axes $x_1$ and $y_1$ such that these axis are a linear combination of the previous motions.

For either alignment technique, the printing control system will then cause the print-head to fire appropriately at the desired print axis as it scans the substrate. In the case of the embodiment described above, the print system will periodically use the pattern recognition system to update and adjust for any misalignment, causing the print-head to fire after alignment has been achieved. Depending on the degree of misalignment, the required update and adjustment steps may have to be repeated more often during the printing operations. Alternatively, the pattern recognition system must scan the substrate initially to assess the amount and direction of misalignment, then printing control system will utilize the misalignment information to adjust the print-head firing accordingly.

While the principles of the disclosure have been illustrated in relation to the exemplary embodiments shown herein, the principles of the disclosure are not limited thereto and include any modification, variation or permutation thereof. For example, while the exemplary embodiments are discussed in relation to a thermal jet discharge nozzle, the disclosed principles can be implemented with different type of nozzles. Moreover, the same or different gases can be used for floating the substrate and for providing a non-oxidizing environment within the chamber. These gases need not be noble gases. Finally, the substrate may enter the system from any direction and the schematic of a tri-chamber system is entirely exemplary.

What is claimed is:

1. A method for depositing an organic material on a substrate, the method comprising the steps of:
   receiving the substrate at an inlet chamber;
   flooding the inlet chamber with nitrogen, and sealing the inlet chamber;
   floating the substrate using a gas bearing;
   directing at least a portion of the substrate to a print-head chamber and, while floating the substrate using a combination of pressure and vacuum, discharging a quantity of the organic material from a discharge nozzle onto the portion of the substrate;
   directing the substrate to an outlet chamber;
   partitioning the print-head chamber from the outlet chamber; and
   unloading the substrate from the outlet chamber.

2. The method of claim 1, further comprising isolating each of the inlet chamber, print-head and outlet chambers from each other using at least one partition.

3. The method of claim 1, wherein the inlet chamber and the outlet chamber are the same.

4. The method of claim 1, wherein said step of discharging produces a patterned film on the substrate.

5. A method for depositing an organic material on a substrate, the method comprising the steps of:
   receiving the substrate at an inlet chamber;
   flooding the inlet chamber with a chamber gas, consisting essentially of nitrogen, and sealing the inlet chamber;
   floating the substrate using a gas bearing;
   directing at least a portion of the substrate to a print-head chamber and, while floating the substrate using a combination of pressure and vacuum, discharging a quantity of the organic material from a discharge nozzle onto the portion of the substrate, forming a patterned film thereon;
   directing the substrate to an outlet chamber;
   partitioning the print-head chamber from the outlet chamber; and
   unloading the substrate from the outlet chamber.

6. The method of claim 5, further comprising isolating each of the inlet chamber, print-head and outlet chambers from each other using at least one partition.

7. The method of claim 5, wherein the inlet chamber and the outlet chamber are the same.

8. A method for depositing an organic material on a substrate, the method comprising the steps of:
   receiving the substrate at an inlet chamber;
   flooding the inlet chamber with a chamber gas and sealing the inlet chamber;
   directing at least a portion of the substrate to a print-head chamber and, while floating and controlling the substrate using the chamber gas and a combination of pressure and vacuum, discharging a quantity of the organic material from a discharge nozzle onto the portion of the substrate, forming a patterned film thereon;
   directing the substrate to an outlet chamber;
   partitioning the print-head chamber from the outlet chamber; and
   unloading the substrate from the outlet chamber.

9. The method of claim 8, wherein the gas of the chamber gas and the gas bearing is nitrogen.

10. The method of claim 8, wherein the inlet chamber and the outlet chamber are the same.

11. The method of claim 8, further comprising isolating each of the inlet chamber, print-head and outlet chambers from each other using at least one partition.

* * * * *

UNITED STATES PATENT AND TRADEMARK OFFICE
CERTIFICATE OF CORRECTION

PATENT NO. : 8,383,202 B2  
APPLICATION NO. : 12/652040  
DATED : February 26, 2013  
INVENTOR(S) : Somekh et al.

Page 1 of 1

It is certified that error appears in the above-identified patent and that said Letters Patent is hereby corrected as shown below:

On the title page item (75), add -- Dr. Conor Madigan, San Francisco, CA (US) --.

Signed and Sealed this
Fifth Day of April, 2016

Michelle K. Lee
*Director of the United States Patent and Trademark Office*